United States Patent
Huinck

(10) Patent No.: US 9,852,937 B2
(45) Date of Patent: Dec. 26, 2017

(54) OBJECT TABLE, LITHOGRAPHIC APPARATUS AND DEVICE MANUFACTURING METHOD

(71) Applicant: ASML NETHERLANDS B.V., Veldhoven (NL)

(72) Inventor: Jeroen Gertruda Antonius Huinck, Den Bosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/509,818

(22) PCT Filed: Aug. 20, 2015

(86) PCT No.: PCT/EP2015/069169
§ 371 (c)(1),
(2) Date: Mar. 8, 2017

(87) PCT Pub. No.: WO2016/041731
PCT Pub. Date: Mar. 24, 2016

(65) Prior Publication Data
US 2017/0299967 A1    Oct. 19, 2017

(30) Foreign Application Priority Data
Sep. 15, 2014 (EP) .................... 14184714

(51) Int. Cl.
*G03F 7/20* (2006.01)
*H01L 21/687* (2006.01)
*H01L 21/683* (2006.01)

(52) U.S. Cl.
CPC ........ *H01L 21/68742* (2013.01); *G03F 7/707* (2013.01); *G03F 7/70708* (2013.01);
(Continued)

(58) Field of Classification Search
CPC .......... H01L 21/68742; H01L 21/6875; H01L 21/68785; H01L 21/68792; H01L 21/6835;
(Continued)

(56) References Cited

U.S. PATENT DOCUMENTS 5,010,824 A    4/1991    DeSantis
6,955,741 B2 *  10/2005    Yamagishi .......... C23C 16/4583
                                                        118/715
(Continued)

FOREIGN PATENT DOCUMENTS

GB    1 374 773     11/1974
JP    H08-159106    6/1996
(Continued)

OTHER PUBLICATIONS

International Search Report and Written Opinion dated Dec. 4, 2015 in corresponding International Patent Application No. PCT/EP2015/069169.
(Continued)

*Primary Examiner* — Michelle M Iacoletti
(74) *Attorney, Agent, or Firm* — Pillsbury Winthrop Shaw Pittman LLP

(57) ABSTRACT

An object table has a lifting mechanism to displace an object from a support surface. The lifting mechanism includes one or more elongated rods extending in a direction substantially perpendicular to the support surface to support the object at a distance from the support surface, the one or more elongated rods being displaceable between positions below the support surface and protruding from the support surface. The mechanism further includes a locking mechanism configured to limit a rotation about a longitudinal axis of the one or more elongated rods. The locking mechanism includes an elastic element that is mechanically connected to both a
(Continued)

housing of the lifting mechanism and the one or more elongated rods, the elastic element configured to have a comparatively low stiffness in the support direction and a comparatively high stiffness in a rotational direction about the longitudinal axis.

20 Claims, 9 Drawing Sheets

(52) U.S. Cl.
CPC ...... *G03F 7/70716* (2013.01); *G03F 7/70725* (2013.01); *G03F 7/70733* (2013.01); *H01L 21/683* (2013.01); *H01L 21/687* (2013.01); *H01L 21/6835* (2013.01); *H01L 21/6875* (2013.01); *H01L 21/68714* (2013.01); *H01L 21/68785* (2013.01); *H01L 21/68792* (2013.01)

(58) Field of Classification Search
CPC ............. H01L 21/68714; H01L 21/683; H01L 21/687; G03F 7/707; G03F 7/70691; G03F 7/70708; G03F 7/70716; G03F 7/70725; G03F 7/70733
See application file for complete search history.

(56) References Cited

U.S. PATENT DOCUMENTS

| 8,446,566 | B2 | 5/2013 | Kuit et al. |
| 2009/0059199 | A1 | 3/2009 | Kuit et al. |
| 2010/0187777 | A1 | 7/2010 | Hao |
| 2011/0236162 | A1 | 9/2011 | Shikayama et al. |

FOREIGN PATENT DOCUMENTS

| JP | H08-316292 | 11/1996 |
| JP | H09-115846 | 5/1997 |
| JP | 2014-099609 | 5/2014 |
| WO | 2008/054332 | 5/2008 |

OTHER PUBLICATIONS

International Preliminary Report on Patentability dated Mar. 30, 2017 in corresponding International Patent Application No. PCT/EP2015/069169.

* cited by examiner

OBJECT TABLE, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/069169, which was filed on Aug. 20, 2015, which claims the benefit of priority of European patent application no. 14184714.5, which was filed on Sep. 15, 2014 and which is incorporated herein in its entirety by reference.

BACKGROUND

Field of the Invention

The present invention relates to an object table, a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Substrates are transported to a lithographic apparatus and from, e.g. using handler robots which can hold a substrate and transport it. Typically, substrates are thus transported from one support (e.g. a shelf in a cassette or a substrate table provided in a substrate handler) to another support (e.g. a substrate table mounted to a positioning device inside the lithographic apparatus)

In order to facilitate such a transfer from one support position to another, a support, e.g. a substrate table, is typically provided with a lifting mechanism enabling an object that is supported by the support to be lifted, i.e. displaced in vertical direction (generally denoted as the Z-direction), thus creating a spacing or gap between the support and the object. By doing so, a hand or end effector of a handler robot can be inserted in said gap more easily, in order to take over the object and transport the object to another holder.

When such a lifting mechanism is used to lift a substrate (in general, an object) from a support, care should be taken to ensure that the object is only displaced in vertical direction. Typically, the horizontal position of an object on a support or support table is known and needs to be maintained. Phrased differently, when a lifting mechanism is used, either to lift an object upwards from a support position on a support to a transfer position where the object is picked up by a robot hand or vice versa, this lifting or lowering of the object has to be performed without displacing the object in the horizontal direction or rotating the object about the vertical direction. In order to avoid such displacement, care should be taken that the lifting mechanism does not rotate about the vertical axis during the lifting or lowering of the object.

Typically, such a lifting mechanism comprises one or more elongated members such as pins which protrude through the support and which can be moved upward or downward by means of an actuating mechanism or actuator. In order to hold the object, the elongated members may e.g. be configured to hold the object by means of vacuum suction. In such arrangement, it is important to avoid or limit a rotation of the elongated members about the vertical axis because such a rotation could e.g. result in a deformation of the object. Further, holding the object by means of vacuum suction may be compromised in case of a rotation of the elongated members.

Known arrangements of such lifting mechanism include rather complex and bulky arrangements which may be difficult to manufacture.

SUMMARY

It is desirable to provide in an object table having a lifting mechanism wherein at least one of the aforementioned problems is mitigated. Therefore, according to a first aspect of the present invention, there is provided an object table comprising:

a support surface configured to support an object;
a lifting mechanism configured to displace the object from the support surface in a support direction substantially perpendicular to the support surface, the lifting mechanism comprising:
  one or more elongated rods extending in the support direction; the one or more elongated rods being displaceable between a first position, wherein the one or more elongated rods are positioned below the support surface, and a second position, wherein the one or more elongated rods protrude the support surface through one or more apertures of the support surface, to support the object at a distance from the support surface;
  a housing, at least partly enclosing the one or more elongated rods;
  a bearing configured to enable a substantially frictionless displacement of the one or more elongated rods between the first position and the second position;
  an actuator configured to displace the one or more elongated rods between the first position and the second position;
  a locking mechanism configured to limit a rotation about a longitudinal axis of the one or more elongated rods, the locking mechanism comprising an elastic element that is mechanically connected to both the housing and the one or more elongated rods, the elastic element being configured to have a comparatively low stiffness in the support direction and a comparatively high stiffness in a rotational direction about the longitudinal axis.

According to an embodiment of the invention, there is further provided an object table comprising:

a support surface configured to support an object;

a lifting mechanism configured to displace the object from the support surface in a support direction substantially perpendicular to the support surface, the lifting mechanism comprising:

one or more elongated rods extending in the support direction; the one or more elongated rods being displaceable between a first position, wherein the one or more elongated rods are positioned below the support surface, and a second position, wherein the one or more elongated rods protrude the support surface through one or more apertures of the support surface, to support the object at a distance from the support surface;

a housing, at least partly enclosing the one or more elongated rods;

a bearing configured to enable a substantially frictionless displacement of the one or more elongated rods between the first position and the second position;

an actuator configured to displace the one or more elongated rods between the first position and the second position; and a locking mechanism configured to limit a rotation about a longitudinal axis of the one or more elongated rods, the locking mechanism comprising a self aligning bearing, the self aligning bearing having a first member connected to the elongated rod and a second member, connected to the housing, co-operating with the first member to form the self aligning bearing, the first member comprising a first bearing surface and the second member comprising a second bearing surface; the first and second bearing surface being constructed and arranged to limit the rotation about the longitudinal axis of the one or more elongated rods, and wherein at least one of the first and second bearing surfaces is displaceable to provide in a self-alignment of the first surface relative to the second surface.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the support or the support table or both comprise an object table according to the present invention for supporting, as the object, the patterning device or the substrate or both.

According to an embodiment of the invention, there is provided a device manufacturing method comprising projecting a patterned beam of radiation onto a substrate, wherein the method further comprises the step of loading a substrate onto an object table according to the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4b depicts a 3D view of a bended leaf spring as can be applied as a flexible element in the first embodiment of FIG. 4a.

DETAILED DESCRIPTION

Figure 1:
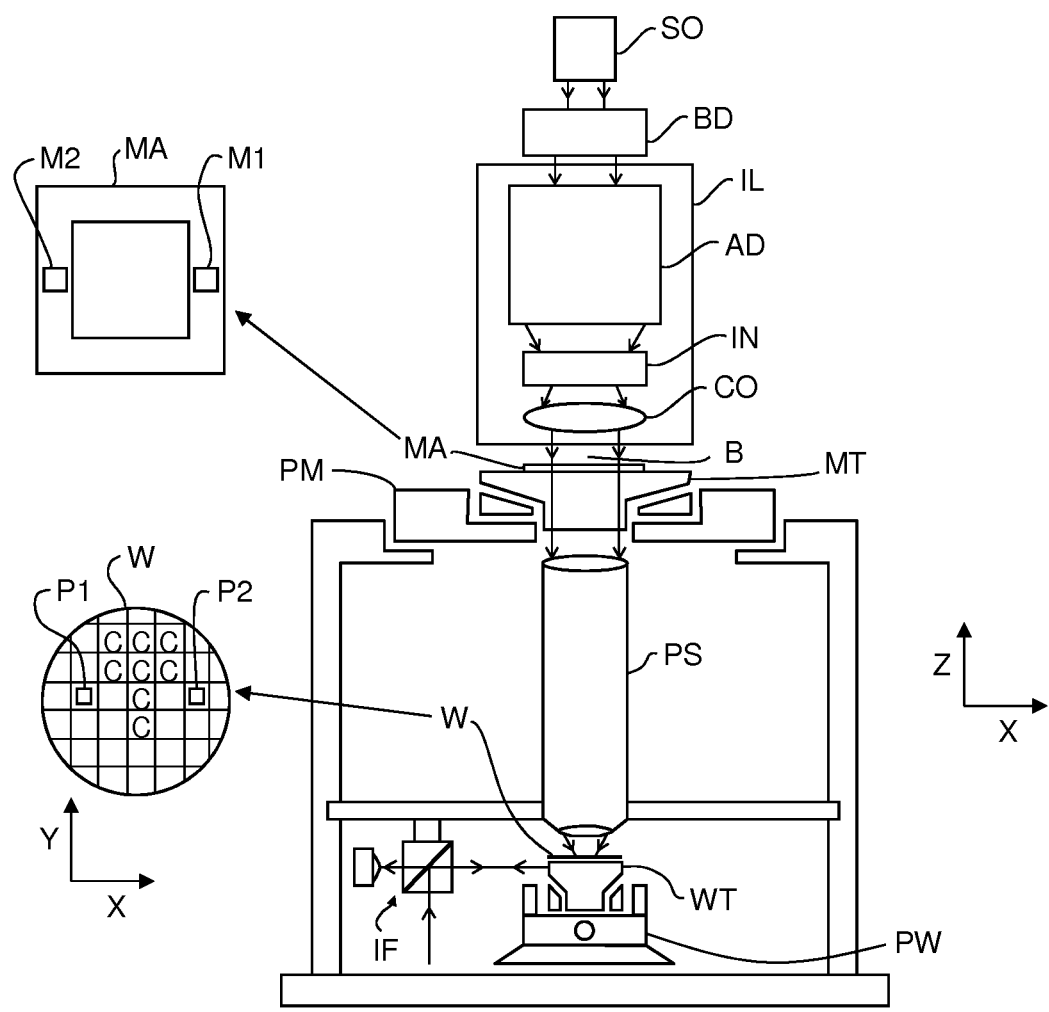
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In order to facilitate the transport of the patterning device and substrate to and from the respective support and support table, the support or support table (or both) may include an object table according to the present invention, the object table including a lifting mechanism as described in more detail below.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
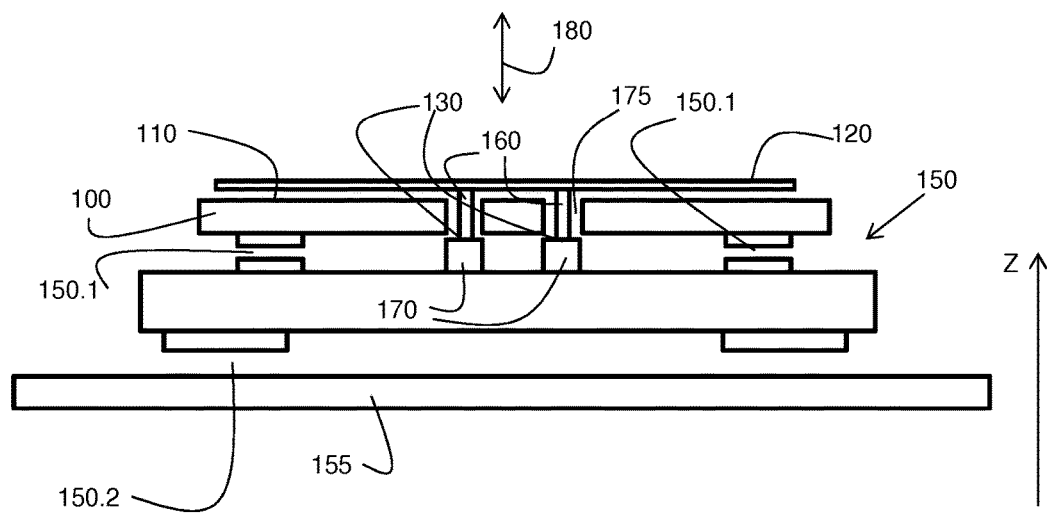
FIG. 2 depicts an object table and positioning device as known in the art.

FIG. 2 schematically depicts an object table and positioning device as known in the art.

FIG. 2 schematically shows an object table 100 having a support surface 110 for supporting an object 120. Typically, the support surface 110 is configured to hold the object by means of an attractive force, e.g. an electrostatic force or a vacuum force. The support surface 110 may e.g. be substantially flat or may be provided with a pattern or protrusions or burls. As described above and schematically shown in FIG. 2, the object table 100 is mounted to a positioning device 150 comprising a short-stroke module 150.1 and a long stroke module 150.2. The short stroke module 150.1 may e.g. comprise a plurality of actuators such as electro-magnetic or piezo-electric actuators for positioning the object table 100 over a comparatively short stroke, e.g. less than 1-3 mm. The long-stroke module 150.2 may e.g. comprise one or more linear motors or a planar motor for displacing the object table 100, along with the short-stroke module over a comparatively large stroke, e.g. >500 mm, relative to a base 155 which can e.g. be part of an isolated base frame to which the object table and positioning device are mounted. The object table 100 as schematically shown further includes a lifting mechanism 130 for lifting the object 120 in a direction substantially perpendicular to the support surface 110, thereby creating or enlarging a gap 140 between the support surface 110 and the object 120. In the arrangement as shown, the lifting mechanism is mounted to the long-stroke module 150.2. The lifting mechanism 130 as shown comprises elongated rods 160 which can be lifted and lowered by an actuator 170, and which can protrude through apertures 175, thus enabling displacing the object along the direction indicated by the arrow 180.

In case such an object table 100 is used in a lithographic apparatus, e.g. to support a substrate, it is important, for the processing of the substrate to be performed appropriately, that the substrate, in general the object, is only displaced in a direction substantially perpendicular to a plane defined by the support surface. Typically, the object table is mounted such that the support surface has a horizontal orientation, the lifting and lowering of the object thus occurring in a substantially vertical direction.

When a substrate is moved from outside the lithographic apparatus to a position on an object table, the substrate is e.g. transported by a robot hand and placed on the elongated rods 160. In general, a position and orientation of the substrate (or object) are determined prior to the substrate (or object) being positioned on the object table. This process is e.g. performed in a so-called substrate handler which may be used to pre-align a substrate and may also be used for the thermal conditioning of the substrate. When the position and orientation of the substrate are known, a robot may accurately position the substrate on the elongated rods of the lifting mechanism. This results in an accurate positioning of the substrate relative to the object table, assuming that the position of the object table is known and provided that the lowering of the substrate onto the support surface 110 does not cause a displacement of the substrate in the plane of the support surface. In a subsequent process step, a substrate in a lithographic apparatus is accurately aligned with a patterning device by detecting the position of alignment marks as e.g. indicated above in relationship to FIG. 1. In order to perform this alignment process effectively, the position of the substrate relative to the object table needs to be known. It is therefore important that, during the lowering of the substrate onto the support surface, the relative position of the substrate and the object table (in the plane of the support surface) is maintained as accurately as possible. It can further be noted that the lowering and lifting of the substrate should be performed without introducing any deformation to the substrate. In order to realize this, it has been proposed to configure the lifting mechanism such that a rotation of the elongated rods about a longitudinal axis of the rods is avoided or at least limited. As a result of such a limitation of the rotation of the rods of the lifting mechanism, the object is substantially prohibited from rotating about the vertical axis and, as a result, the horizontal position and orientation of the object, relative to the object table, is maintained.

Figure 3A:
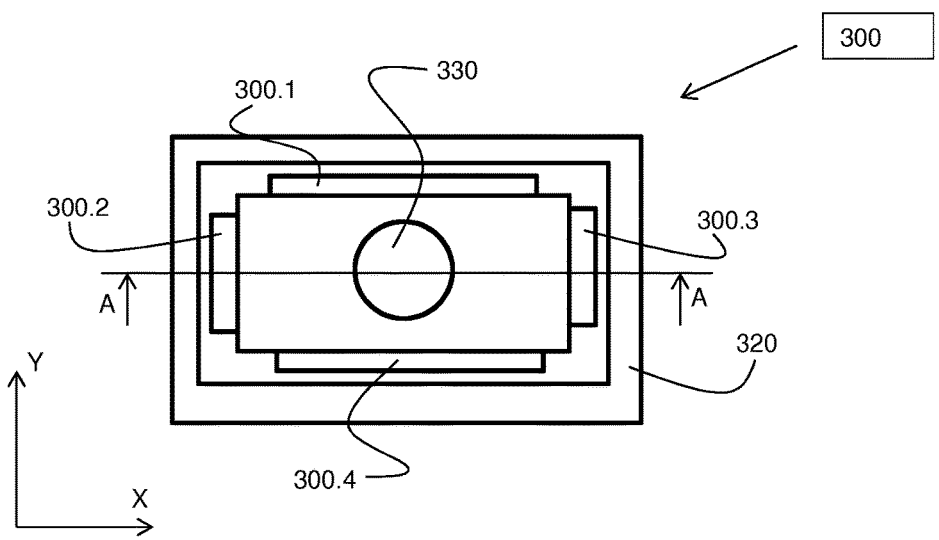
FIGS. 3a and 3b depict a top view of a bearing arrangement for limiting a rotation of an elongated rod of a lifting mechanism about a longitudinal axis of the rod.
Figure 3B:
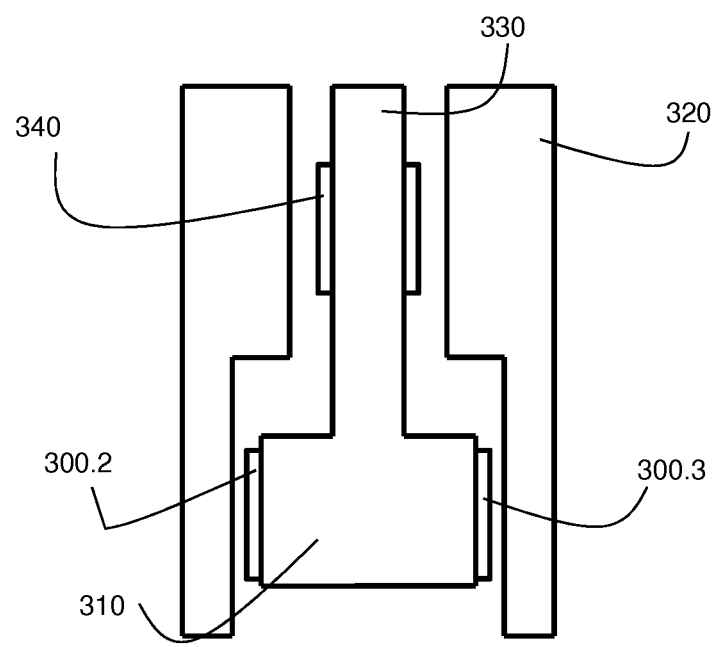

In a known lifting mechanism, a set of substantially flat bearings is used to limit or prohibit a rotation of the elongated rod or rods about the longitudinal axis. A top-view of a possible arrangement of such bearings is schematically shown in FIGS. 3a and 3b. FIG. 3a schematically shows a top view of a bearing arrangement 300 as can be applied in a known lifting mechanism. The bearing arrangement comprises 4 bearings pads 300.1-300.4 mounted to a member 310 of the lifting mechanism having a rectangular cross-section, the bearing pads having a substantially flat surface facing substantially flat surfaces of the housing 320 of the lifting mechanism. An air or gas flow can be provided in between the facing surfaces, thus holding the member 320 in a substantially fixed position relative to the housing 310, in the XY-plane. FIG. 3a further shows an elongated rod 330 of the lifting mechanism. FIG. 3b shows a cross-sectional view along the cross-section AA of FIG. 3a and schematically shows the housing 320, the rectangular shaped member 310 including the bearing pads 300.2 and 300.3, the elongated rod 330 and a cylindrical bearing 340 that is configured to enable substantially frictionless displacement of the elongated rod 330 relative to the housing 320 in the vertical direction.

Due to the use of the bearing arrangement as described, a rotation of the elongated rod is, to a large extend, made impossible. As a possible drawback however, the arrangement as schematically shown in FIGS. 3a and 3b may be difficult to manufacture; typically, the member 310 and the elongated rod 330, including the bearing surfaces, are manufactured as a single piece on a single tool, in order to obtain the required tolerances of the bearings. In this respect, it should be noted that the upper bearing 340 (arranged between the housing 320 and the rod 330) is a cylindrical bearing 340, whereas the lower bearing (between the member 310 and the housing 320) is a bearing having substantially flat surfaces. It should further be noted that, for the appropriate operation of the arrangement as shown, stringent requirements need to be met with respect to flatness and parallelism of the facing surfaces of the bottom bearing formed by bearing pads 300.1-300.4. It can further be noted that similar manufacturing issues arise to manufacture the housing which accommodates the elongated rod 330 and the member 310.

Figure 4A:
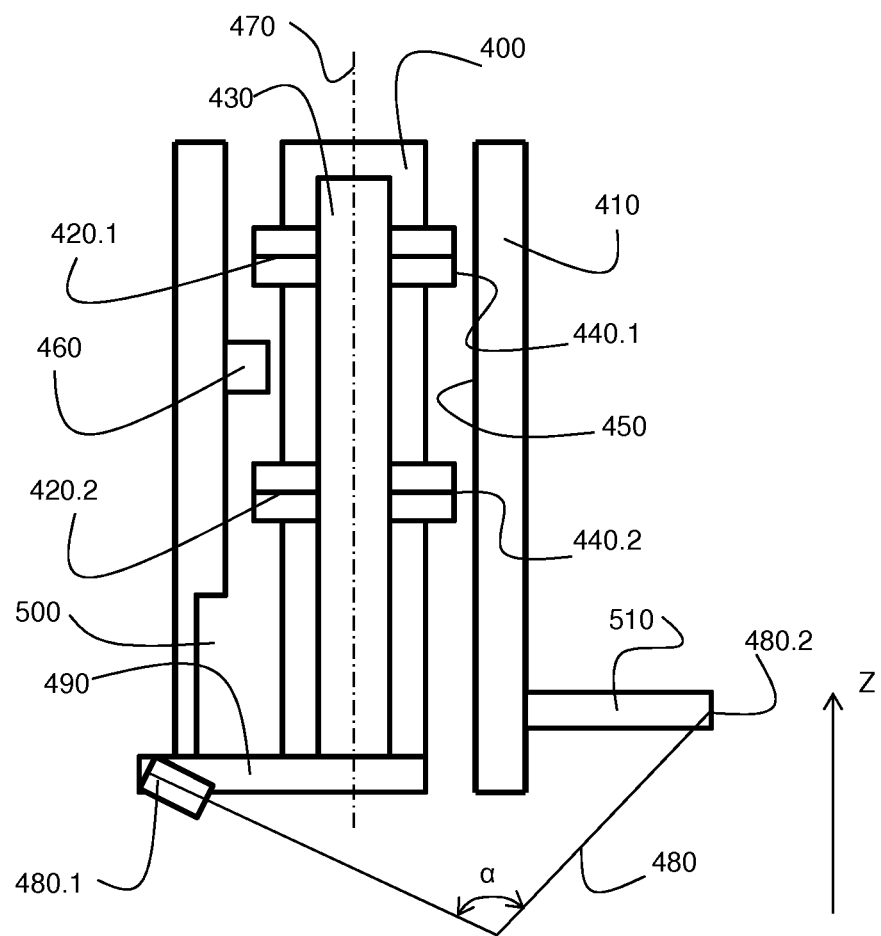
FIG. 4a depicts a cross-sectional view of a first embodiment of a lifting mechanism as can be applied in an object table according to the present invention.

FIG. 4a schematically shows a first embodiment of a lifting mechanism as can be applied in an object table according to the invention. The lifting mechanism as shown comprises an elongated rod 400, at least partly enclosed by a housing 410. A distance between the elongated rod and the housing in the plane perpendicular to the longitudinal axis of the rod is maintained by a bearing 420; the bearing being configured to enable substantially frictionless displacement of the elongated rod relative to the housing in the vertical direction, in general, the support direction. In the embodiment as shown, the bearing 420 comprises a pair of cylindrical air bearings 420.1, 420.2. In the embodiment as shown, the elongated rod is a hollow rod, whereby a supply of air to the air bearings is provided via the interior 430 of the rod 400 towards the cylindrical surfaces 440.1, 440.2 of the air bearings facing the interior 450 of the housing 410.

Note that alternative arrangements, whereby the air for the air bearings is provided via the housing may be considered as well.

The lifting arrangement as shown further comprises an actuator 460 configured to displace the elongated rod relative to the housing in the vertical direction. As an example of such an actuator, an electromagnetic actuator such as a permanent magnet actuator or a reluctance type actuator can be used. Such a permanent magnet actuator can e.g. comprise a coil assembly, e.g. mounted to the housing and a permanent magnet assembly, mounted to the elongated rod. The coil assembly can include one or more coils which can be energized by an electric current, thus resulting in a force being generated between the coil assembly and the permanent magnet assembly. Other types of actuators such as pneumatic or hydraulic types of actuators can be considered as well.

In the embodiment as shown, the actuator 460 is arranged in between the pair of bearings 420.1, 420.2 along the longitudinal axis 470 of the rod 400. In such embodiments, the actuator 460 can be considered to be enclosed by the pair of bearings 420.1, 420.2, thus providing a shielded compartment for the actuator. In such an arrangement, the outward flow of air applied by the air bearings hinders any contamination such as particles from entering the shielded compartment and affecting the operation of the lifting mechanism. In particular, in case an electromagnetic actuator is used, metal particles could be attracted by the actuator and damage the housing or the rod, when no measures are taken. Enclosing the actuator by a pair of cylindrical air bearings, as done in the embodiment shown, provides in an effective manner to avoid the entrance of particles in the volume between the housing 410 and the elongated rod 400.

In order to limit or hinder a rotation of the elongated rod 400 about the longitudinal axis 470 of the rod 400, relative to the housing 410, the lifting mechanism further comprises a locking mechanism.

In the embodiment as shown, the locking mechanism comprises an elastic element 480 that is mechanically connected to both the housing 410 and the elongated rod 400, the elastic element 480 being configured to have a comparatively low stiffness in the vertical direction (i.e. the Z-direction) and a comparatively high stiffness in a rotational direction about the longitudinal axis 470. In the embodiment as shown, the elastic element 480 comprises a leaf spring, in particular a bended leaf spring. In the embodiment as shown, the bended leaf spring is mechanically mounted on one end 480.1 to an extension 490 of the elongated rod extending through an aperture 500 of the housing 410 and on the other end 480.2 to an extension 510 of the housing 410. The connections may e.g. be hinges, i.e. pivotable connections or substantially rigid connections.

Figure 4B:
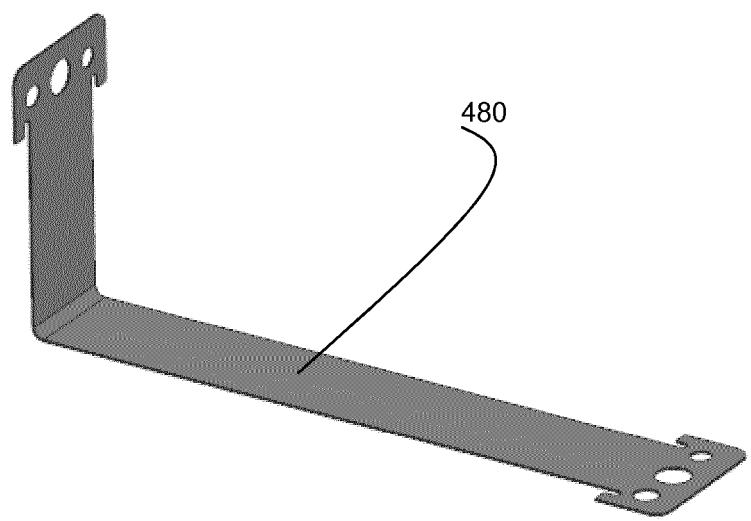

FIG. 4b schematically shows a 3D view of a bended leaf spring as can be applied as the elastic element 480.

Figure 5A:
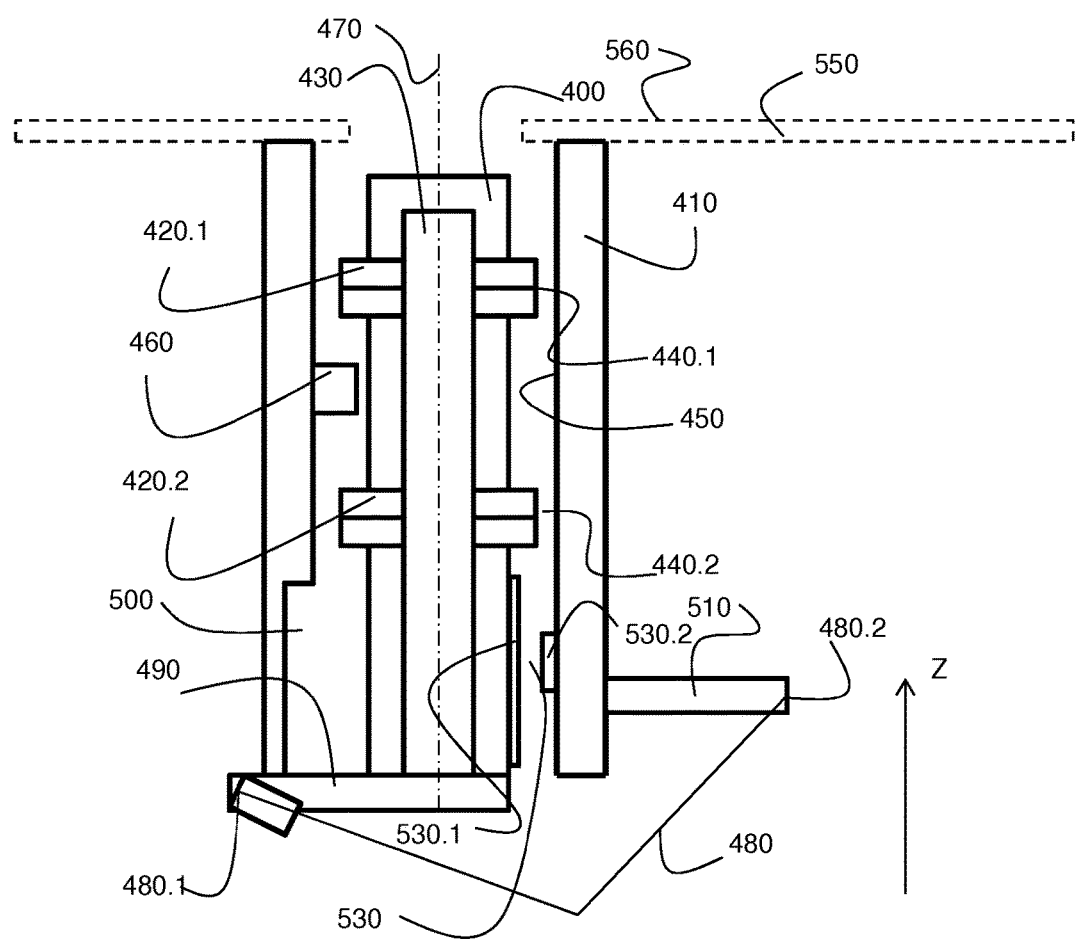
FIGS. 5a and 5b depict a cross-sectional view of the first embodiment of the lifting mechanism in a lower position and an upper position.
Figure 5B:
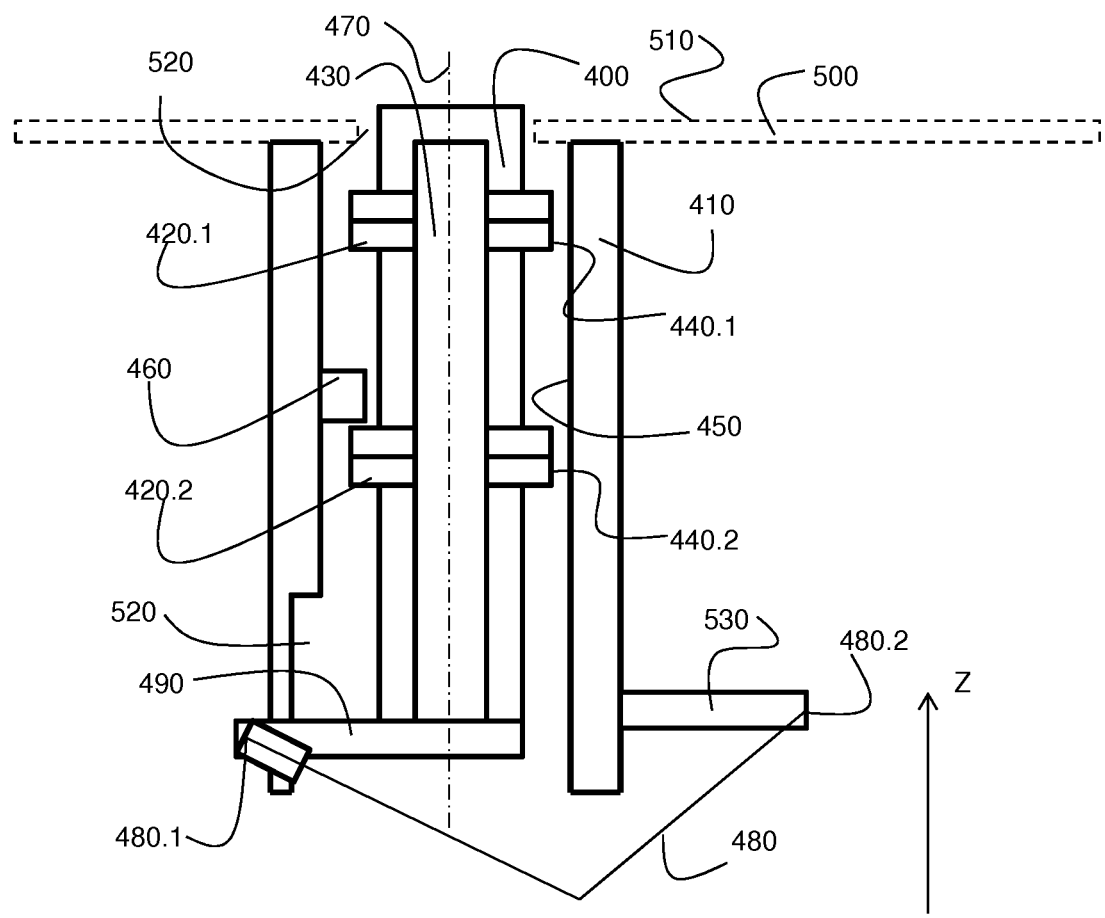

FIGS. 5a and 5b schematically show the embodiment of FIG. 4, whereby the elongated rod 400 is positioned in a first, lower position, whereby the rod is below a support (indicated by the dotted line 500) having a support surface 550, and in a second, upper position, whereby the elongated rod 400 protrudes an aperture 520 through the support 560.

In an embodiment, the bended leaf spring 480 is configured to have an angle α (see FIG. 4a)=90° when in a neutral position, e.g. when the elongated rod is in a position half way between the lower position and the upper position.

In an embodiment, end stops may be provided to define a top position and a bottom position of the elongated rod 400 relative to the housing 410.

In an embodiment, the lifting mechanism may further comprise a position measurement system 530 for measuring a position of the housing 410 relative to the one or more elongated rods 400 in the support direction. In an embodiment, such a position measurement may e.g. include a grating 530.1, mounted to the elongated rod 410 and a sensor 530.2 mounted to the housing 410. A position signal of the position measurement system 530 may e.g. be applied by a position controller of the actuator 460 to control the position of the elongated rod 400 relative to the housing 410.

As schematically shown in FIGS. 5a and 5b, the housing 410 of the lifting mechanism may be mounted to the support 550, below the supporting surface 560. Alternatively, the lifting mechanism as applied in a object table according to the present invention may be mounted to a separate structure, e.g. a long-stroke positioning device to which the object table is mounted, see e.g. FIG. 2. In such alternative embodiment, the housing 410 of the lifting mechanism does not contact the support 550.

Figure 6A:
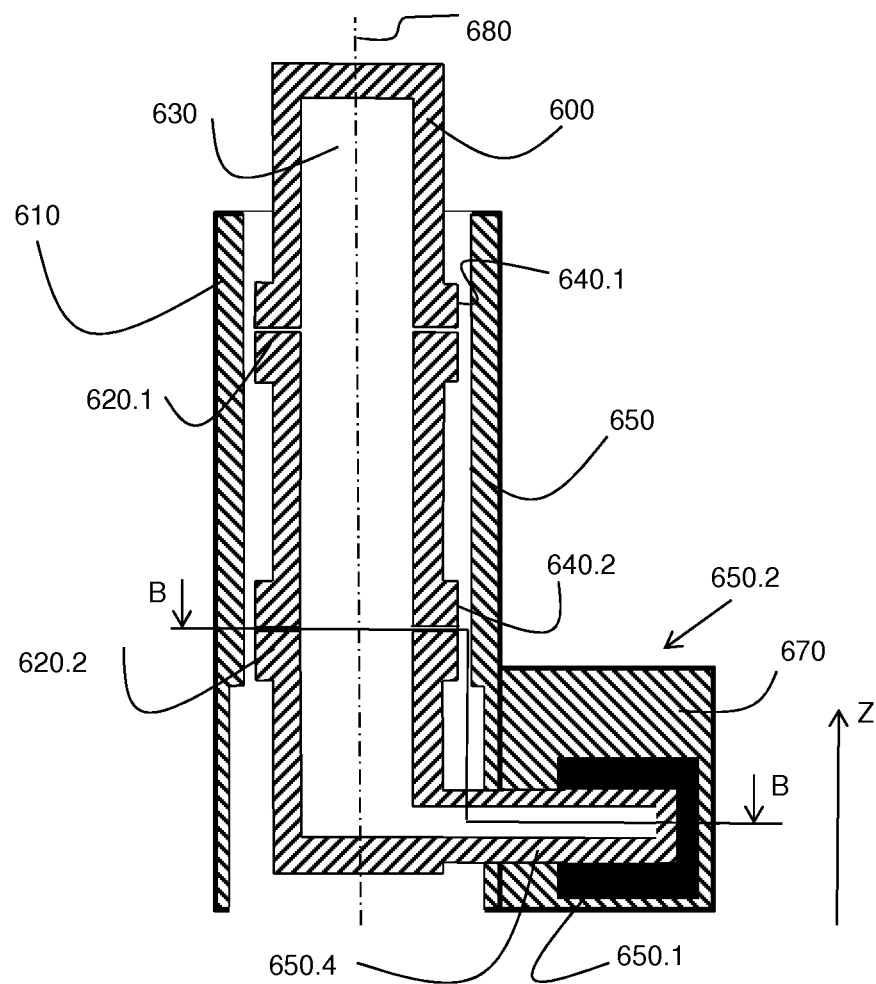
FIGS. 6a and 6b depict a cross-sectional view of a second embodiment of a lifting mechanism as can be applied in an object table according to the present invention.
Figure 6B:
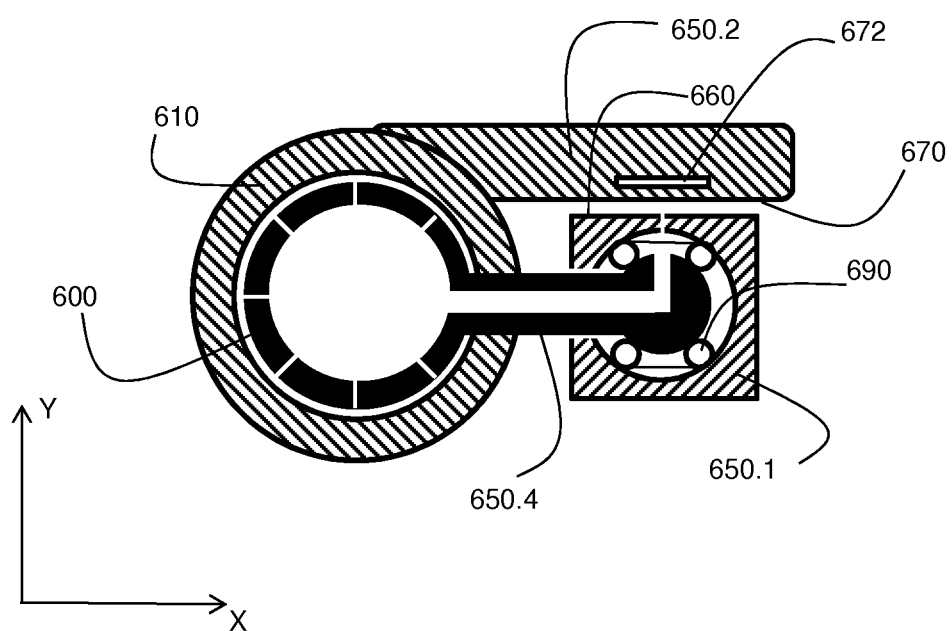

FIGS. 6a and 6b schematically shows a second embodiment of a lifting mechanism as can be applied in an object table according to the present invention.

Similar to the embodiment of FIG. 4a, the lifting mechanism as shown comprises an elongated rod 600, at least partly enclosed by a housing 610. A distance between the elongated rod 600 and the housing in the plane perpendicular to the longitudinal axis of the rod is maintained by a bearing 620; the bearing being configured to enable substantially frictionless displacement of the elongated rod relative to the housing in the vertical direction, in general, the support direction. In the embodiment as shown, the bearing 620 comprises a pair of cylindrical air bearings 620.1, 620.2. In the embodiment as shown, the elongated rod 600 is a hollow rod, whereby a supply of air to the air bearings is provided via the interior 630 of the rod 600 towards the cylindrical surfaces 640.1, 640.2 of the air bearings facing the interior 650 of the housing 610. A supply of air to the interior 630 can e.g. be realized via an air supply hose or the like.

In the embodiment as shown, the lifting mechanism further comprises a self aligning air bearing 650. The self aligning bearing is a gas type bearing comprising a first member 650.1 that is connected to the elongated rod 600 (via a hollow tube 650.4 through which a gas (e.g. air) can be supplied to the first member 650.1) and a second member 650.2 that is connected to the housing 610.

In the embodiment as shown, the first member 650.1 comprises a first, substantially flat, bearing surface 660 (see FIG. 6b) facing a second, substantially flat, bearing surface 670 of the second member 650.2. The first and second bearing surfaces 660 and 670 are constructed and arranged to limit the rotation about the longitudinal axis 680 of the elongated rod 600. This can e.g. be realized by configuring the self aligning bearing as a pre-stressed gas bearing, whereby an attractive force is generated between the facing surfaces (e.g. an magnetic attractive force generated by co-operation of a ferromagnetic element and a permanent magnet member arranged in the first and second members 650.1 and 650.2) together with a repelling force, e.g. generated by an outward gas flow, outward from the first bearing surface 660 and towards the second bearing surface 670.

In accordance with the second embodiment, the first and second bearing members 650.1 and 650.2 are configured to self-align with each other. This can e.g. be realized by providing that at least one of the first and second bearing surfaces 660, 670 is displaceable relative to the respective elongated rod 600 and housing 610 to which they are connected. In the embodiment as shown, this is realized by mounting the first bearing member 650.1 in a pivotable manner to the hollow tube 650.4. this can e.g. be done by providing a flexible sealing between the hollow tube 650.4 and the first bearing member 650.1, as e.g. shown in FIG. 6b.

FIG. 6b schematically shows a top view of the embodiment of FIG. 6a, along the line BB. FIG. 6b schematically shows the elongated rod 600, the housing 610, the hollow tube 650.4 to which the first bearing member 650.1 is mounted and the second bearing member 650.2. In the embodiment as shown, the first and second bearing members have facing surfaces 660 and 670 which operate as an air bearing. By means of a gas flow towards the surface 670 of the second bearing member and an attractive force between the first and second bearing member (e.g. generated by means of one or more permanent magnets 672, e.g. embedded in the second bearing member 650.2) a distance between the first and second bearing member can be maintained. In accordance with the embodiment shown, the bearing surfaces may self-align. This can e.g. be realized by a flexible mounting of the first bearing member 650.1 to the hollow tube 650.4, e.g. by means of a sealing comprising a pair of O-rings 690. By doing so, the first bearing member 650.1 may e.g., to some extend, pivot about the X-axis and the Z-axis (perpendicular to the XY-plane), thus allowing a self-alignment of the first surface 660 relative to the second surface 670. As a result, there are less stringent requirements w.r.t. the parallelism of both bearing surfaces 660 and 670. It should be noted that the flexible mounting, e.g. using the pair of O-rings as shown, should be sufficiently flexible to enable the bearing surfaces 660 and 670 to maintain this parallelism.

In the arrangement as schematically shown in FIGS. 3a and 3b, the bearing surfaces 300.1-300.4 (and the facing surfaces of the housing 320) need to be substantially flat, and, the bearing surfaces need to be substantially parallel to the housing surfaces throughout the operating range (i.e. the range of movement) of the lifting mechanism. Due to the self-alignment of the mechanism shown in FIGS. 6a and 6b, the latter requirement need not be met in this embodiment, thus improving the manufacturability of the housing, the elongated rod and the bearing members 650.1 and 650.2. In the embodiment as shown, both the pair of cylindrical air bearings 620.1, 620.2 and the self-aligning bearing (650.1, 650.2) may be supplied by a common air supply. Although in the above reference is made to 'air' to supply the bearings, it will be understood that any other gas may also be suited to supply the bearings as described.

Further, as an alternative to the embodiment as shown in FIGS. 6a and 6b, an embodiment may be devised whereby the facing surface 670 of the first bearing member 650.1 is, to some extend, displaceable, e.g. pivotable about the X-axis and/or the Z-axis, to provide in a self-alignment of the bearing surfaces 660 and 670.

Similar to the embodiment described with respect to FIGS. 4a-5b, the embodiment of FIGS. 6a and 6b can be provided with a position measurement system and/or with end stops defining the extreme positions of the elongated rod relative to the housing.

In an embodiment, the one or more elongated rods as applied in the lifting mechanism may be provided at an end portion facing the object to be supported, with attractive means for attracting the object to the end portion. Examples of such attractive means may e.g. include the use of vacuum suction or the use of electrostatic forces. These attractive means may be used to hold the object when the object is supported by the one or more elongated rods of the lifting mechanism. In an embodiment, the object table according to the present invention is provided with at least three lifting mechanism for lifting and lowering an object relative to a support surface.

The object table according to the present invention may advantageously be applied in a lithographical apparatus to facilitate in the positioning of substrates and/or patterning devices. The lifting mechanism as applied ensures that the object that is loaded or unloaded from the object table, substantially maintains its position and orientation in the plane parallel to the support surface. As a result, positional information obtained during an earlier processing step, e.g. a pre-alignment step, still remains valid after an object has been lowered on the support surface of the object table.

In an embodiment, there is provided an object table comprising: a support surface configured to support an object; a lifting mechanism configured to displace the object from the support surface in a support direction substantially perpendicular to the support surface, the lifting mechanism comprising: one or more elongated rods extending in the support direction; the one or more elongated rods being displaceable between a first position, wherein the one or more elongated rods are positioned below the support surface, and a second position, wherein the one or more elongated rods protrude the support surface through one or more apertures of the support surface, to support the object at a distance from the support surface; a housing, at least partly enclosing the one or more elongated rods; a bearing configured to enable a substantially frictionless displacement of the one or more elongated rods between the first position and the second position; an actuator configured to displace the one or more elongated rods between the first position and the second position; a locking mechanism configured to limit a rotation about a longitudinal axis of the one or more elongated rods, the locking mechanism comprising an elastic element that is mechanically connected to both the housing and the one or more elongated rods, the elastic element being configured to have a comparatively low stiffness in the support direction and a comparatively high stiffness in a rotational direction about the longitudinal axis.

In an embodiment, the elastic element comprises a leaf spring. In an embodiment, the leaf spring is a bended leaf spring.

In an embodiment, there is provided an object table comprising: a support surface configured to support an object; a lifting mechanism configured to displace the object from the support surface in a support direction substantially perpendicular to the support surface, the lifting mechanism comprising: one or more elongated rods extending in the support direction; the one or more elongated rods being displaceable between a first position, wherein the one or more elongated rods are positioned below the support surface, and a second position, wherein the one or more elongated rods protrude the support surface through one or more apertures of the support surface, to support the object at a distance from the support surface; a housing, at least partly enclosing the one or more elongated rods; a bearing configured to enable a substantially frictionless displacement of the one or more elongated rods between the first position and the second position; an actuator configured to displace the one or more elongated rods between the first position and the second position; and a locking mechanism configured to limit a rotation about a longitudinal axis of the one or more elongated rods, the locking mechanism comprising a self aligning bearing, the self aligning bearing having a first member connected to the elongated rod and a second member, connected to the housing, co-operating with the first member to form the self aligning bearing, the first member comprising a first bearing surface and the second member comprising a second bearing surface; the first and second bearing surface being constructed and arranged to limit the rotation about the longitudinal axis of the one or more elongated rods, and wherein at least one of the first and second bearing surfaces is displaceable to provide in a self-alignment of the first surface relative to the second surface.

In an embodiment, the bearing and the self aligning bearing are gas bearings, having a common gas supply. In an embodiment, the bearing includes a pair of cylindrical gas bearings arranged along the longitudinal axis, and wherein the actuator is arranged in between the pair of cylindrical air bearings, along the longitudinal axis. In an embodiment, the actuator is an electromagnetic actuator comprising a coil assembly mounted to the housing and a permanent magnet assembly mounted to the one or more elongated rods. In an embodiment, the lifting mechanism further comprises a position measurement system for measuring a position of the housing relative to the one or more elongated rods in the support direction. In an embodiment, an end portion of the one or more elongated rods is configured to hold the object by means of vacuum suction.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the support and/or the substrate table comprises an object table as described herein for supporting the respective patterning device and/or the substrate.

In an embodiment, there is provided a device manufacturing method comprising projecting a patterned beam of radiation onto a substrate, wherein the method further comprises the step of loading a substrate onto an object table as described herein. Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. An object table system comprising:
   a support surface configured to support an object; and
   a lifting mechanism configured to displace the object from the support surface in a support direction substantially perpendicular to the support surface, the lifting mechanism comprising:
   one or more elongated rods, extending in the support direction, configured to support the object at a distance from the support surface, the one or more elongated rods being displaceable between a first position, wherein the one or more elongated rods are positioned below the support surface, and a second position, wherein the one or more elongated rods protrude from the support surface through one or more apertures of the support surface;
   a housing, at least partly enclosing the one or more elongated rods;
   an actuator configured to displace the one or more elongated rods between the first position and the second position; and a locking mechanism configured to limit a rotation about a longitudinal axis of the one or more elongated rods, the locking mechanism comprising an elastic element that is mechanically connected to both the housing and the one or more elongated rods, the elastic element being configured to have a comparatively low stiffness in the support direction and a comparatively high stiffness in a rotational direction about the longitudinal axis, wherein the elastic element comprises a leaf spring.

2. The object table system according to claim 1, wherein the leaf spring is a bended leaf spring.

3. The object table system according to claim 1, wherein the actuator is an electromagnetic actuator comprising a coil assembly mounted to the housing and a permanent magnet assembly mounted to the one or more elongated rods.

4. The object table system according to claim 1, wherein the lifting mechanism further comprises a position measurement system configured to measure a position of the housing relative to the one or more elongated rods in the support direction.

5. The object table system according to claim 1, wherein an end portion of the one or more elongated rods is configured to hold the object by vacuum suction.

6. A lithographic apparatus comprising:
a support constructed to support a patterning device, the patterning device being capable of imparting a radiation beam with a pattern in its cross-section to form a patterned radiation beam;
a substrate table constructed to hold a substrate; and
a projection system configured to project the patterned radiation beam onto a target portion of the substrate,
wherein the support and/or the substrate table comprises an object table system according to claim 1 to support the respective patterning device and/or substrate.

7. The object table system according to claim 1, further comprising a bearing configured to enable a substantially frictionless displacement of the one or more elongated rods between the first position and the second position.

8. The object table system according to claim 7, wherein the bearing includes a pair of cylindrical gas bearings arranged along the longitudinal axis, and wherein the actuator is arranged in between the pair of cylindrical air bearings, along the longitudinal axis.

9. An object table system comprising:
a support surface configured to support an object; and
a lifting mechanism configured to displace the object from the support surface in a support direction substantially perpendicular to the support surface, the lifting mechanism comprising:
one or more elongated rods, extending in the support direction, configured to support the object at a distance from the support surface, the one or more elongated rods being displaceable between a first position, wherein the one or more elongated rods are positioned below the support surface, and a second position, wherein the one or more elongated rods protrude from the support surface through one or more apertures of the support surface;
a housing, at least partly enclosing the one or more elongated rods;
an actuator configured to displace the one or more elongated rods between the first position and the second position; and
a locking mechanism configured to limit a rotation about a longitudinal axis of the one or more elongated rods, the locking mechanism comprising a self aligning bearing, the self aligning bearing having a first member connected to the elongated rod and a second member, connected to the housing, co-operating with the first member to form the self aligning bearing, the first member comprising a first bearing surface and the second member comprising a second bearing surface; the first and second bearing surfaces being constructed and arranged to limit the rotation about the longitudinal axis of the one or more elongated rods, and wherein the first and/or second bearing surfaces is displaceable to provide self-alignment of the first bearing surface relative to the second bearing surface.

10. The object table system according to claim 9, wherein the the self aligning bearing is a gas bearing.

11. The object table system according to claim 9, further comprising a bearing configured to enable a substantially frictionless displacement of the one or more elongated rods between the first position and the second position.

12. The object table system according to claim 11, wherein the bearing includes a pair of cylindrical gas bearings arranged along the longitudinal axis, and wherein the actuator is arranged in between the pair of cylindrical gas bearings, along the longitudinal axis.

13. The object table system according to claim 9, wherein the actuator is an electromagnetic actuator comprising a coil assembly mounted to the housing and a permanent magnet assembly mounted to the one or more elongated rods.

14. The object table system according to claim 9, wherein the lifting mechanism further comprises a position measurement system configured to measure a position of the housing relative to the one or more elongated rods in the support direction.

15. The object table system according to claim 9, wherein an end portion of the one or more elongated rods is configured to hold the object by vacuum suction.

16. A lithographic apparatus comprising:
a support constructed to support a patterning device, the patterning device being capable of imparting a radiation beam with a pattern in its cross-section to form a patterned radiation beam;
a substrate table constructed to hold a substrate; and
a projection system configured to project the patterned radiation beam onto a target portion of the substrate,
wherein the support and/or the substrate table comprises an object table system according to claim 4 to support the respective patterning device and/or substrate.

17. A device manufacturing method comprising:
projecting a beam of radiation onto an object; and loading an object
onto an object table using a lifting mechanism to displace the object relative to a support surface of the object table, the lifting mechanism comprising:
one or more elongated rods, extending in a support direction substantially perpendicular to the support surface, supporting the object at a distance from the support surface, the one or more elongated rods being displaceable between a first position, wherein the one or more elongated rods are positioned below the support surface, and a second position, wherein the one or more elongated rods protrude from the support surface through one or more apertures of the support surface;
an actuator displacing the one or more elongated rods between the first position and the second position; and a locking mechanism configured to limit a rotation about a longitudinal axis of the one or more elongated rods, the locking mechanism comprising an elastic element that is mechanically connected to both the one or more elongated rods and a housing that at least partly encloses the one or more elongated rods, the elastic element configured to have a comparatively low stiffness in the support direction and a comparatively high stiffness in a rotational direction about the longitudinal axis, wherein the elastic element comprises a leaf spring.

18. The method according to claim 17, further comprising measuring a position of the housing relative to the one or more elongated rods in the support direction.

19. The method according to claim 17, wherein an end portion of the one or more elongated rods holds the object by vacuum suction.

20. The method according to claim 17, further comprising using a bearing to enable a substantially frictionless displacement of the one or more elongated rods between the first position and the second position.

\* \* \* \* \*